(12) United States Patent
Deng et al.

(10) Patent No.: US 6,838,689 B1
(45) Date of Patent: Jan. 4, 2005

(54) BACKSIDE ALIGNMENT AND PACKAGING OF OPTO-ELECTRONIC DEVICES

(75) Inventors: Hongyu Deng, Arcadia, CA (US); Chun Lei, Arcadia, CA (US)

(73) Assignee: Finisar Corporation, Sunnyvale, CA (US)

( * ) Notice: Subject to any disclaimer, the term of this patent is extended or adjusted under 35 U.S.C. 154(b) by 259 days.

(21) Appl. No.: 10/256,054

(22) Filed: Sep. 25, 2002

Related U.S. Application Data
(60) Provisional application No. 60/357,239, filed on Feb. 14, 2002.

(51) Int. Cl.[7] .......................... H01J 40/14; H01L 23/544
(52) U.S. Cl. ...................... 250/559.3; 250/239; 385/92; 385/93; 257/797
(58) Field of Search .............................. 250/559.3, 239, 250/216, 208.1; 257/81, 432, 433, 434, 797; 385/88–94

(56) References Cited

U.S. PATENT DOCUMENTS

| 5,796,714 | A |   | 8/1998  | Chino et al.            |
|-----------|---|---|---------|-------------------------|
| 5,821,532 | A | * | 10/1998 | Beaman et al. ... 250/239 |
| 5,998,878 | A | * | 12/1999 | Johnson ............ 257/797 |
| 6,056,448 | A |   | 5/2000  | Sauter et al.           |
| 6,118,917 | A |   | 9/2000  | Lee et al.              |
| 6,249,627 | B1|   | 6/2001  | Bond et al.             |
| 6,295,307 | B1|   | 9/2001  | Hoden et al.            |

* cited by examiner

*Primary Examiner*—Kevin Pyo
(74) *Attorney, Agent, or Firm*—Workman Nydegger (57) ABSTRACT

A die having at least one opto-electronic device disposed on a front-side of the die has its backside mounted to a submount with the backside positioned to align the front-side opto-electronic devices with respect to the submount. A first set of alignment features are formed on the backside of the die which are aligned to the front-side. The first set of a alignment features is then aligned to a second set of alignment features disposed on the submount and the backside is bounded into place.

40 Claims, 7 Drawing Sheets

BACKSIDE ALIGNMENT AND PACKAGING OF OPTO-ELECTRONIC DEVICES

RELATED APPLICATIONS

This application claims priority under 35 U.S.C.§ 119(e) to U.S. patent application Ser. No. 60/357,239, entitled "Backside Alignment And Packaging Of Opto-Electronic Devices," filed Feb. 14, 2002, the contents of which are hereby incorporated by reference in their entirety in the present patent application.

BACKGROUND OF THE INVENTION

1. Field of the Invention

The present invention relates generally to packaging opto-electronic devices as part of an assembly in which the opto-electronic devices must be aligned to other optical components.

2. Description of Background Art

Opto-electronic devices, such as semiconductor lasers or optical detectors, are commonly packaged as part of an assembly of mechanical, electrical, and optical components. Opto-electronic devices are often packaged as part of an assembly designed to couple light to other optical elements. As one example, an individual opto-electronic device may be packaged to couple light with a single optical fiber. As another example, opto-electronic devices may comprise an array of receivers or transmitters that is packaged as part of a connector assembly for coupling light with an array of optical fibers.

Opto-electronic devices that are optically coupled to other devices or waveguides typically need to be suitably aligned. However, as the alignment requirements of opto-electronic devices become more stringent, active alignment techniques may be required which increase the cost, complexity, and labor required to package the opto-electronic devices as part of assembly.

What is desired is an improved technique to package opto-electronic devices with a high degree of alignment accuracy.

SUMMARY OF THE INVENTION

A die having opto-electronic devices accurately aligned to a submount is disclosed. The die has at least one front-side opto-electronic device. The backside of the die has at least one backside alignment feature, with the position of the backside alignment feature being indicative of the location of the front-side opto-electronic devices. The backside of the die is bonded to a submount with the backside alignment features aligned to corresponding features disposed on the submount. In one embodiment, an optical vision system is used to align the two sets of alignment features.

One application of the submount is in an optical assembly in which the opto-electronic device disposed on the submount is optically coupled to at least one other optical component. In one embodiment, of an optical assembly, an alignment guide aligns the submount to the optical component. The submount includes a guide feature, such as guide holes for receiving guide pins, for aligning the submount to least one other optical component.

The figures depict a preferred embodiment of the present invention for purposes of illustration only. One of skill in the art will readily recognize from the following discussion that alternative embodiments of the structures and methods disclosed herein may be employed without departing from the principles of the claimed invention.

DETAILED DESCRIPTION OF THE PREFERRED EMBODIMENTS

The present invention generally includes a method for aligning and mounting opto-electronic devices of a die to a submount. The packaged submount may be connected to other optical components as part of an assembly, such as an optical fiber connector assembly.

Figure 1:
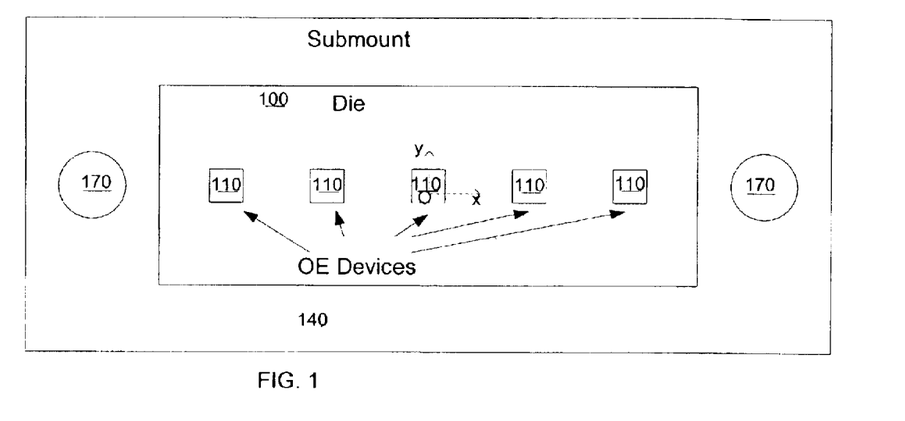
FIG. 1 is a top view of a die packaged on a submount.

FIG. 1 is a top view of a die 100 having one or more opto-electronic devices 110. A die 100 having opto-electronic devices 10 is also commonly known in the opto-electronic art as a "chip," particularly if it includes more than one active opto-electronic device 110. As used hereinafter, it will be understood that die 100 includes any chip having one or more active or passive opto-electronic devices 110.

Figure 2A:
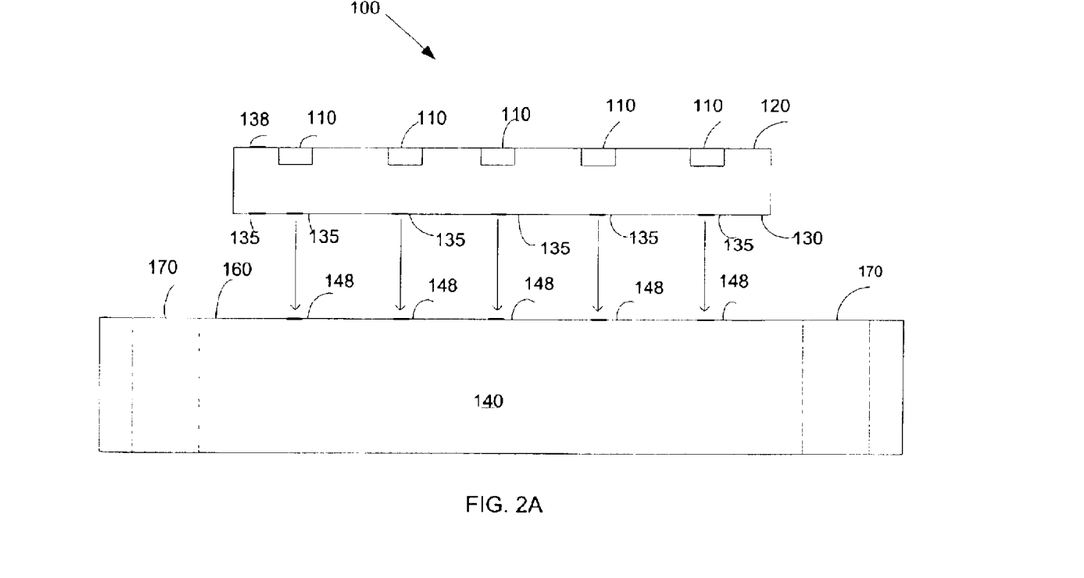
FIG. 2A is a side view of the die and submount illustrating backside alignment features.

Referring to the side view of FIG. 2, die 100 has one or more opto-electronic devices 110 arranged along a top surface region 120 of a die portion of a substrate material 102 having a bottom surface 130. Top surface region 120 is commonly known as the "frontside" of the die or, alternatively, the "topside." Backside 130 is commonly known as the "bottom surface" or, alternatively, as the "bottom side" of the die. The opto-electronic devices 110 may comprise active devices, such as semiconductor Vertical Cavity Surface Emitting Lasers (VCSELs), Distributed Feedback (DFB)Lasers, Electro-Modulator Lasers (EMLs), Light-Emitting Diodes (LEDs), or optical detectors. However, it will be understood that the opto-electronic devices 110 may comprise passive optical devices, such as lenses, optical deflectors, or waveguides. In one embodiment, die 100 includes an array of opto-electronic devices 110 disposed in frontside 120, such as a transmitter array of VCSELs or a receiver array of optical detectors. In one embodiment, opto-electronic devices 110 are formed in the frontside 120 via a series of semiconductor device fabrication processes. Alternatively, a hybrid processes to transfer opto-electronic devices 110 formed on one substrate and bond them to another substrate 102 may also be used.

The backside of die 100 is mounted to a mounting surface 160 of submount 140. Submount 140 includes at least one alignment guide 170, such as alignment holes, to align submount 140 to at least one other element. It is desirable to align the frontside opto-electronic devices 110 with respect to a desired position on the submount 140 using at least one mounting alignment feature 148 disposed on the mounting surface 160 of submount 140.

The accuracy of the alignment of the opto-electronic devices 110 of die 100 relative to mount 140 may be referenced to an x and y displacement along the surface of the submount 140 relative to an origin, O, of the mount with respect to a central portion of die 100. Origin, O, may, for example, correspond to the geometric center of several fiducial marks on mount 140. Additionally, for two or more opto-electronic devices 110, there is a corresponding angular displacement, theta, of the opto-electronic devices 110 relative to the origin, O.

In a junction-up configuration the opto-electronic devices 110 are disposed along a top surface region of die 100. Since die 100 has a substantial thickness (e.g., typically greater than 100 microns) conventional optical techniques to use the top surface of die 100 to align the die to a feature on the mount may result in comparatively poor x, y, and theta alignment of the opto-electronic devices 110 due to the difficulties in simultaneously imaging a top surface disposed at a substantial height difference with respect to the surface of the submount 140.

In accord with the present invention, backside alignment features 135 are formed on the backside 130 of die 100. For example, the alignment features may comprise spaced-apart alignment features (e.g., an arrangement of alignment crosses or other types of alignment marks) formed by etching backside 130 of substrate 102 or patterning a suitable material disposed on backside 130 (e.g., patterning a metal layer disposed on bottom surface 130). It will be understood that a spaced apart arrangement of backside alignment features 135 substantially extending over a corresponding area of front-side opto-electronic devices 110 is preferred to facilitate accurate angular alignment of die 100.

The backside alignment features 135 are aligned to a suitable set of front-side alignment features disposed on top surface 120 of die 100. For example, backside alignment features 135 may be aligned to individual opto-electronic devices 110 if the individual opto-electronic devices 110 have suitable dimensions and shapes. Alternatively, front-side alignment features 138 may be formed in frontside 120. One benefit of using front-side alignment marks 138 is that the shape and arrangement of the top-surface alignment features may be selected to facilitate accurate alignment with bottom surface alignment features 135.

The backside alignment features 135 may be aligned to the top surface devices 110, or alignment features 138 using any suitable backside alignment technique. In one embodiment, an infrared camera is used to align a photolithography mask for forming the backside alignment features 135. For example, a contact aligner having an infrared camera may be used to pattern a photoresist mask deposited on backside 130 to form a photoresist mask for transferring the alignment features 135 to backside 130. The infrared radiation used to view through the substrate is selected to have a wavelength that penetrates through substrate 102. Commercially available contact mask aligners, such as the Karl Suss MA 6 Contact Aligner manufactured by SUSS MicroTec of Munich, Germany, have alignment microscopes for backside infrared alignment of a photolithographic mask to front-side surface features.

The backside alignment features 135 may be formed on substrate 102 prior to die separation using any suitable method for patterning an alignment mark, such as using a photolithographic process to pattern and etch alignment features in backside 130. Alternatively, the alignment marks may be formed on an individual die 100 subsequent to die separation. However, for this embodiment die 100 is preferably sufficiently large in area to permit a lithographic process to be performed on a substantial portion of bottom surface 130. Examples of processes that may be used to form the backside alignment features include wet etching, dry etching, and liftoff.

Submount 140 may comprise any mounting surface 160 to which die 100 is mounted. However, a submount that includes input/output connections is commonly known in the art of opto-electronics as a "chip carrier." For example, silicon chip carriers typically comprise an insulating silicon substrate onto which electrical connection regions are formed. Examples of submount materials include: metal mounts, such as TO header with a flat portion having a top surface adhesion layer; a ceramic insulating substrate, such as a ceramic insulator coated with a layer of a conductive metal; and silicon substrates, such as insulating silicon substrates coated with one or more metal layers to facilitate bonding and/or provide an electrical contact. Examples of bonding processes include eutectic metal bonding, solder bonding, and epoxy bonding.

A suitable adhesion layer may be deposited on the surface of submount 160 to promote the bonding process and/or to facilitate forming an electrical contact to die 100. The choice of the top adhesion layer on the surface of submount 140 will depend, in part, on the bonding process that is used. For example, if a eutectic bond is to be formed, such as a Au/Sn eutectic bond, the adhesion layer on the surface of mount 140 and a corresponding contact/adhesion layer on backside 130 must have a material composition consistent with forming the eutectic bond. If a solder bond is to be formed between mount 140 and backside 130, then solder balls may be formed on the surface of mount 140 using a suitable flip-chip solder ball process. Additionally, if a solder ball bonding process is to be used, solder balls can be formed in alignment features 148 of the surface of submount 140.

Referring to FIG. 2A, submount 140 includes mount alignment features 148 shaped and positioned to permit registration of backside alignment features 135 onto alignment features 148. For example, if backside alignment features 148 comprise cross marks, then mount alignment features 148 may comprise any feature onto which the cross marks may be centered to bring die 100 into proper alignment with submount 140.

Figure 2B:
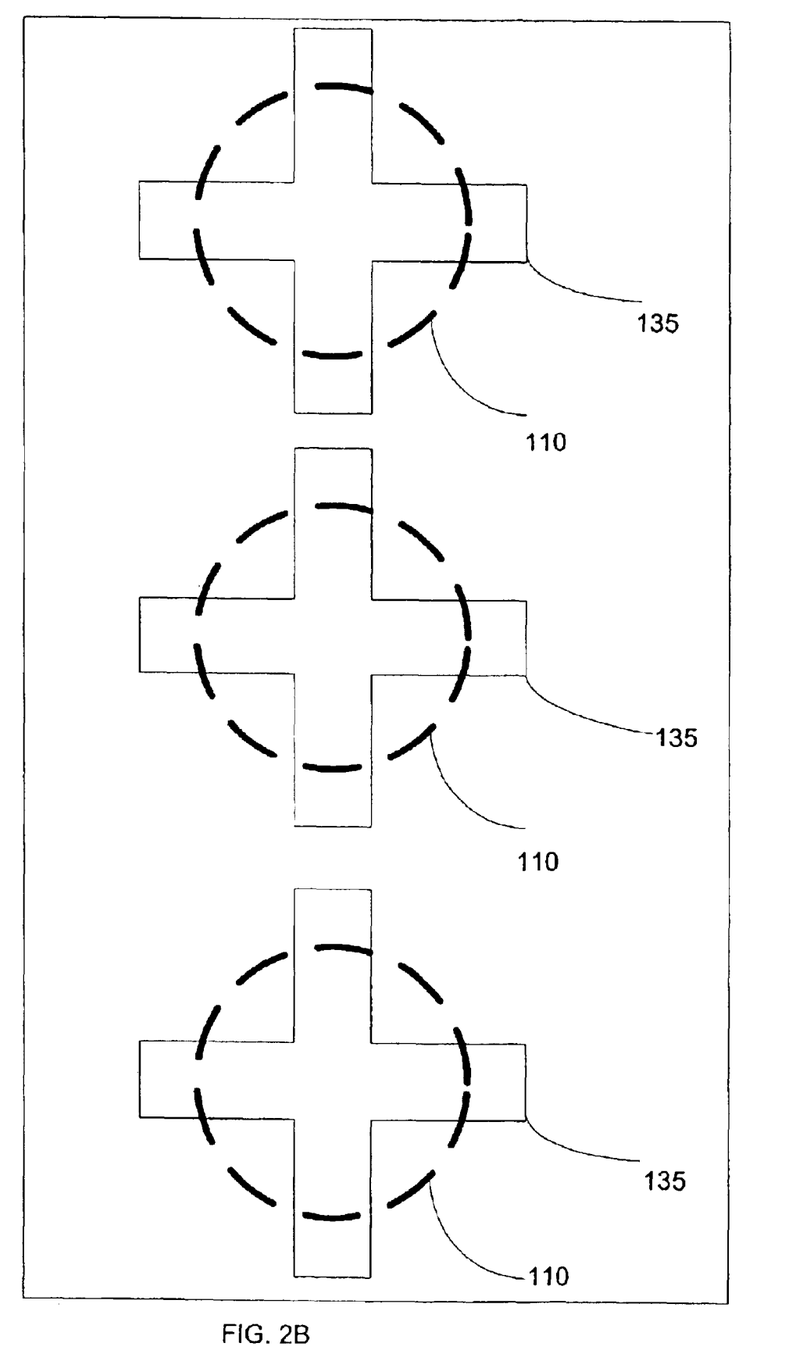
FIG. 2B is an illustrative top view of a patterned backside of the alignment features of a die having top side VCSELs.

In one embodiment, the mount alignment features 148 are fabricated using a photolithographic process to define metal alignment marks on mounting surface 160. For example, the mount alignment features 148 may comprise regions having different metal thicknesses or compositions formed by a plating or liftoff process. FIG. 2B shows an illustrative set of alignment features 135 for an array of VCSEL devices 110. For VCSELs having a top-side VCSEL aperture that is approximately round, each backside alignment feature may comprise a cross-shaped metal opening.

In one embodiment, the backside alignment features 135 of die 100 are aligned to mount alignment features 148 using a die bonder having a viewing system. Since all of the alignment features reside on substantially the same optical plane, this facilitates the alignment process, since all of the alignment features can be simultaneously brought into focus under high power magnification. The die is then bonded to submount with a suitable time-temperature-pressure condition to complete the bonding process (e.g., to form a eutectic, solder, or epoxy bond).

The die bonder preferably includes a motorized stage and pick up head for translating the die with respect to the submount and placing the die on the submount with a preselected pressure, temperature, and time. Commercially available die bonders, such as the Model 410 CP Precision Bonder manufactured by the Semiconductor Equipment Corporation of Moorpark, Calif., include a retractable cube beam splitter to present die and submount images simultaneously. Using such a die bonder, the operator lowers the die to within a preselected separation distance from the mounting surface (e.g., several microns). The operator then uses the viewing system to align the die with the submount and then retracts the cube beam splitter. Alternatively, the alignment can also be carried out with a machine vision system. The die is then dropped or pressed down with a preselected pressure onto the submount. Die bonders like the Model 410 CP have a heated stage and localized heaters to provide heat during the bonding process. The die is held at a preselected temperature-time profile to complete the bonding process.

Note that the backside alignment features and mounting surface alignment features 148 are closely spaced when the operator uses the cube beam splitter of the die bonder to bring the alignment features into registration with other. This permits high power magnification to be used with a high image quality, which improves the accuracy of the alignment process. In contrast, if the operator tried to directly align front-side alignment features 138 to mounting surface alignment features 148 the difference in optical height of the two sets of features would make it impractical to image both sets of features simultaneously, particularly at a high level of magnification sufficient to permit accurate alignment. Thus the backside alignment marks 135 of the present invention permit a substantial improvement in the accuracy of a visual alignment process.

Figure 2C:
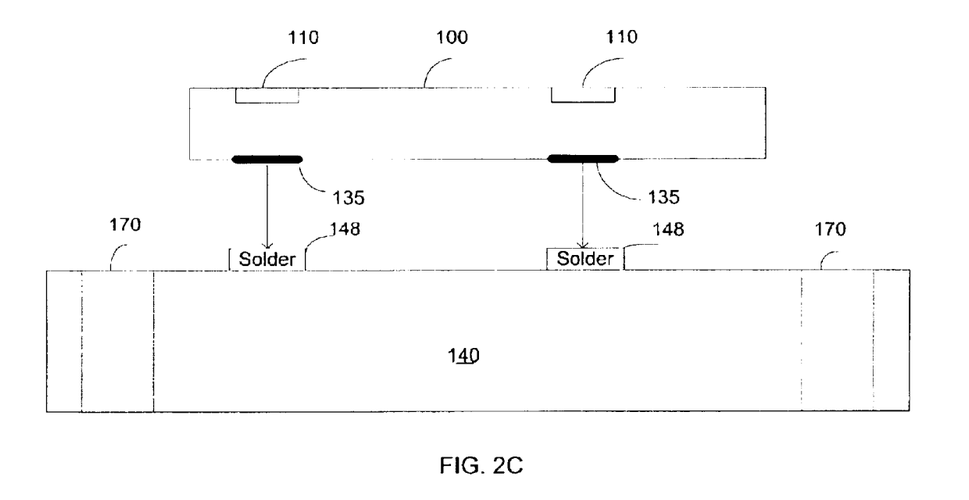
FIG. 2C is a side view illustrating a method in which solder bumps are used to facilitate alignment between the die and the submount.

FIG. 2C is a side view illustrating an alternate alignment process. Solder ball bonding processes generate significant surface tension between a solder ball on one surface and a corresponding metal/solder region on another surface during a solder reflow step. As shown in FIG. 2B, some or all of the alignment features 148 oil mounting surface may comprise solder balls or solder regions. The corresponding backside alignment feature 135 of each solder region 148 may comprise a compatible metal and/or a solder region. Consequently, when features 135 and 148 are brought into proximate contact and heated to reflow the solder, the surface tension will act to bring the die into proper registration. The alignment method illustrated in FIG. 2B may be used, for example, with any imaging system to bring the alignment features into proximate contact. However, it will also be understood that it may also be used in combination with a cube beam splitter to facilitate maintaining accurate alignment during the bonding process.

Figure 3:
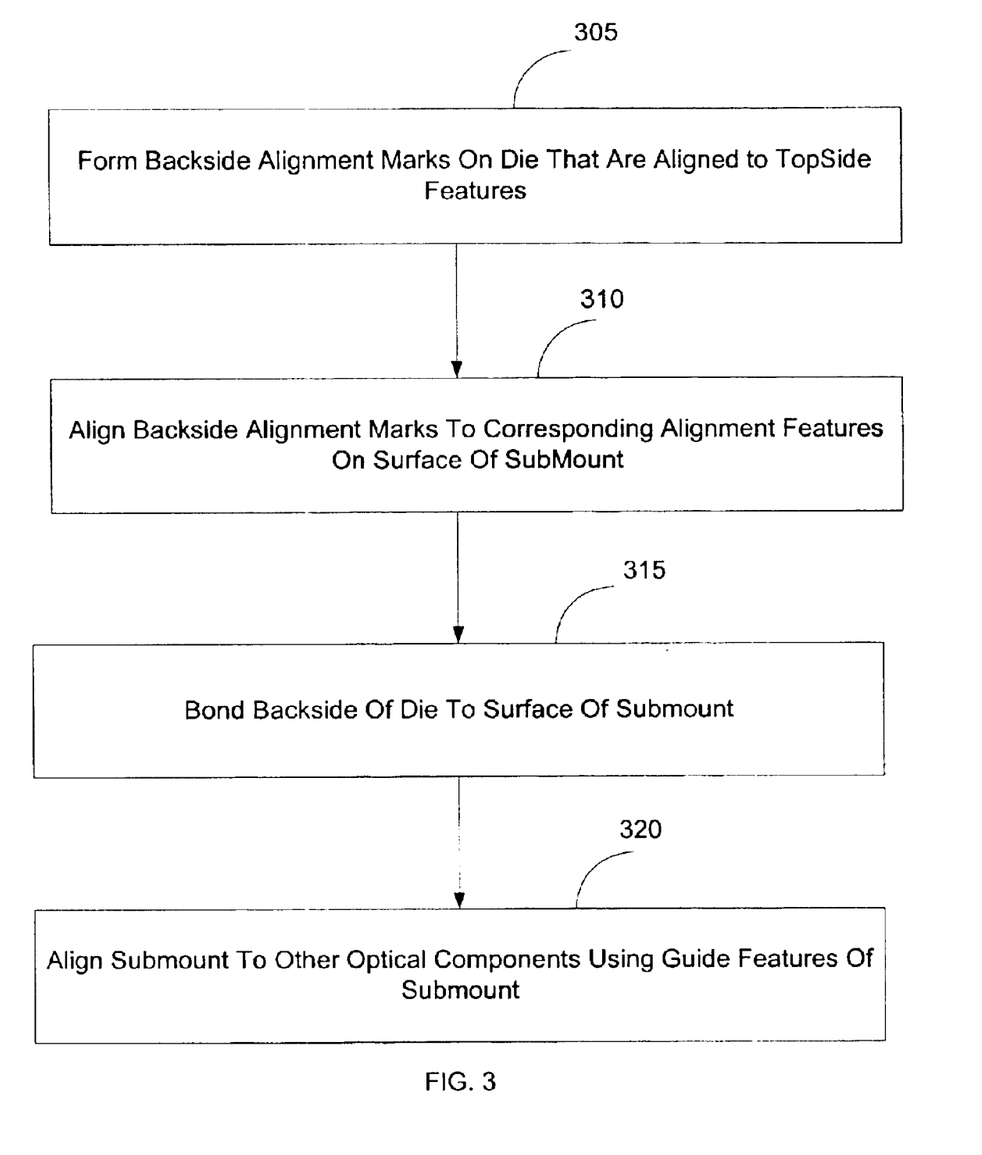
FIG. 3 is a flow chart of one method of mounting a die.

FIG. 3 is a flow chart of a general alignment and bonding process in accord with the present invention. Backside alignment features are formed 305 on the die that are aligned to front-side features such that they arc indicative of the position of front-side opto-electronic components. The backside alignment features are aligned to corresponding alignment features on the surface of the submount 310. The backside of the die is bonded to the surface of the submount 315. This permits the opto-electronic devices 110 of the die to be aligned to other optical components (e.g., a lens array) by aligning the submount to other optical components using guide features of the submount 320.

One benefit of the alignment method of the present invention is that it permits opto-electronic devices 110 to be mounted with a high degree of alignment accuracy with respect to a submount. Backside alignment techniques, such as those using an infrared viewing system, permit backside alignment marks to be aligned to front-side die features to within about one micron. The optical viewing system and alignment process during die bonding may introduce an additional offset. The cumulative errors are such that the present invention permits each opto-electronic device to be mounted within a few microns of an intended location with respect to the plane of mounting surface 130.

In one embodiment, the packaged submount is connected to other components as part of an assembly for coupling signals to one or more optical fibers. Submount 140 preferably includes at least one alignment guide 170 for aligning submount 160 to at least one other optical or opto-electronic component 180 of an optical assembly, such as an optical connector. The alignment guide is shaped to bring the submount and its opto-electronic devices 110 into alignment with another set of optical components, such as lenses, waveguides, or optical fibers. For example, the alignment guide may be one or more holes shaped to engage corresponding guide pins. Alternatively, the alignment guide may include an alignment pin. Other examples of alignment guides include alignment grooves, ridges, or other surfaces shaped to engage another component into alignment. It will be understood that the alignment guide 170 may be selected to be compatible with a commercially available connector package. For example, the MT type connector utilizes two precision-diameter guide pins to engage accurately molded guide pin holes in the ferrule and other parts of the connector assembly.

Figure 4:
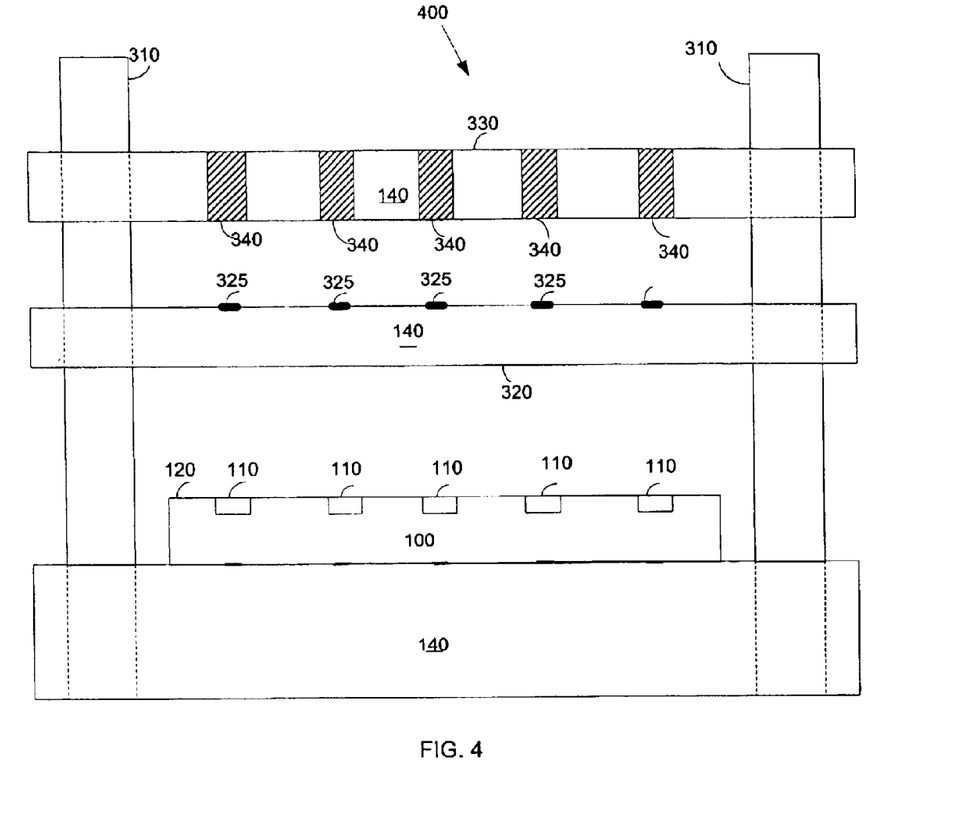
FIG. 4 shows a portion of an optical assembly having additional optical components aligned to the submount.

FIG. 4 is a side view of an exemplary optical connector assembly 400 for coupling light between an array of opto-electronic devices 110 on a die 100 to the entrance surface of an array of waveguides 330, such as an optical fiber array comprised of two or more optical fibers. As one example, optical connector assembly 400 may be designed to be compatible with an MT or MTP connector. Guide pins 310 are received by guide holes in submount 140. A lens, such as a lens array 320 having micro-lenses 325 held within a lens housing having holes for engaging the guide pins, is held a pre-selected distance from the top surface 120 of die 100 and serves to facilitate coupling of light between the entrance surface 340 of each fiber and a corresponding opto-electronic device 110. In one embodiment, spacers (not shown) are included to maintain a predetermined spacing between the opto-electronic devices 110 and the lens array 320. As one example, the opto-electronic devices 110 may comprise an array of VCSELs for coupling light to an array of fibers. Alternatively, opto-electronic devices 110 may comprise an array of optical detectors.

It will be understood that optical connector assembly 400 may be combined with a suitable ferrule to form a complete connector. A variety of vendors sell connectors with defined tolerances. For example, US Concec® of Hickory, N.C., manufactures MT and MTP® connectors with guide pins and a spring action housing for coupling 4, 8, or 12 optical fibers. USConcec® also sells ferrules adapted to house arrays of opto-electronic devices 110, such as VCSELs. Other vendors, such as Fiberdyne Labs, Inc., of Frankfort, N.Y. also sells MTP connector devices.

Figure 5:
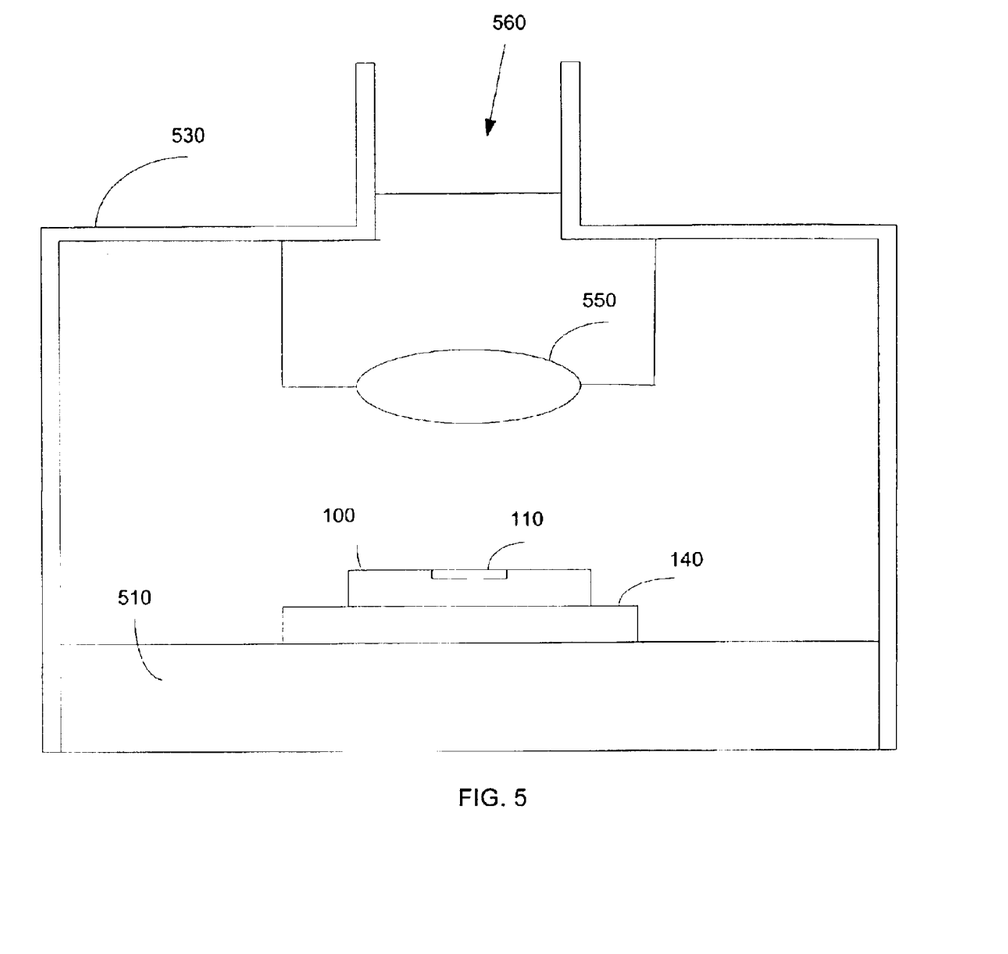
FIG. 5 is a side view of an embodiment of an opto-electronic device mounted on a header including a lens for coupling the opto-electronic device to an optical fiber.

It will be understood that the alignment method of the present invention may be used for a variety of different opto-electronic applications. Referring to FIG. 5, a die 100 may be mounted to a submount 140 of a header. Some types of headers are designed to mate with a fiber holder 530 having an alignment bore 560 for receiving an optical fiber. A lens 550 may be connected to the fiber holder 530 or to the header 510. Using the alignment method of the present invention, the opto-electronic devices 110 of die 100 may be accurately aligned with respect to lens 550, thereby facilitating optical coupling with a fiber mounted in alignment bore 560.

Figure 6:
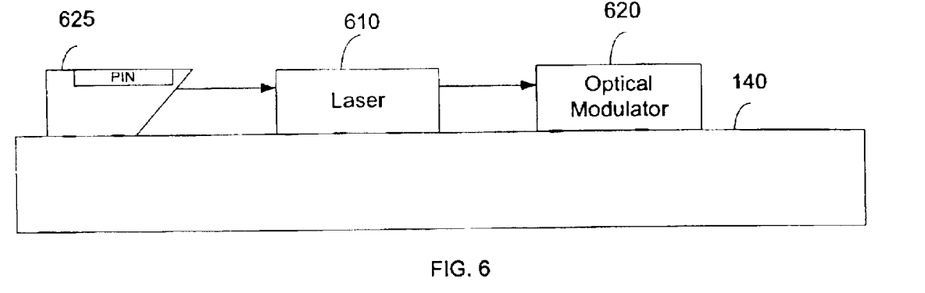
FIG. 6 is a side view illustrating an embodiment in which optical devices are coupled to devices on the same submount.

Referring to FIG. 6, another application of the alignment method of the present invention is for a hybrid optical integrated circuit in which one or more of the optical devices 110 must be accurately aligned and mounted with respect to other optical devices. As an illustrative example, it may be desired to mount an edge-emitting laser 610 and another component receiving the light from one of the facets of the laser, such as an optical modulator 620, optical detector 625, optical deflector (not shown), or optical waveguide (not shown) on one submount 140. For this case, it is desirable to accurately align the laser with respect to the submount in order to obtain the desired optical coupling to the other components mounted or formed on the submount.

The alignment method of the present invention provides several benefits. One benefit is that it provides improved alignment. For example, using the present method it is believed that opto-electronic devices 110, such as VCSELs, may be aligned to within about one to two microns of fiducial marks on the submount. This is because infrared contact aligners permit backside alignment features to be aligned to within about one-to-two microns of front-side features across a die in regards to x-y coordinates and to within a fraction of a degree in regards to angular displacement. The optical vision system of a die bonder permits accurate alignment of backside alignment features to within about one micron or less. Precision guide pins of MT type connectors may be specified to provide passive alignment to within about a micron or less. Consequently, the cumulative alignment error of the opto-electronic devices 110 is believed to be less than about five microns, which permits passive alignment for many types of lasers and detectors.

Another benefit of the present invention is that it facilitates optically coupling arrays of opto-electronic devices 110. For examples, in arrays of VCSELs or optical detectors which are to be coupled to a fiber array, each opto-electronic device 110 should be aligned within approximately the same tolerance to achieve comparable optical coupling to a corresponding optical fiber. The present invention may be used for aligning each opto-electronic device 110 to an array of lenses or waveguides, facilitating uniform optical coupling.

Still another benefit of the present invention is that the improved alignment accuracy permits increased optical coupling. Conventionally, it is difficult to achieve an alignment tolerance of better than about ten-to-twenty microns for junction-up mounted devices, such as VCSELs. Consequently, active alignment is commonly required in conventional mounting techniques to achieve a high coupling efficiency. In contrast, the present invention permits accurate alignment, resulting in an improvement in optical coupling efficiency, particularly for passive or semi-passive alignment techniques.

Still yet another benefit of the present invention is that it reduces the expensive labor required to form an accurately aligned assembly. In particular, the high initial alignment accuracy of the opto-electronic devices with respect to the submount permits a passive alignment process to be used to form an opto-electronic assembly.

While particular embodiments and applications of the present invention have been illustrated and described, it is to be understood that the invention is not limited to the precise construction and components disclosed herein and that various modifications, changes and variations which will be apparent to those skilled in the art may be made in the arrangement, operation and details of the method and apparatus of the present invention disclosed herein without departing from the spirit and scope of the invention as defined in the appended claims.

What is claimed is:

1. For an opto-electronic die having a front-side having at least one opto-electronic device and an opposed backside, a method of mounting the die to a submount, the method comprising:

aligning a first set of alignment features disposed on the backside of the die to a corresponding second set of alignment features disposed on a mounting surface of the submount; and bonding the backside of the die to the mounting surface;

the first set of alignment features positioned to be indicative of the location of the at least one opto-electronic device disposed on the frontside.

2. The method of claim 1, further comprising forming the first set of alignment features by:

depositing photoresist on the backside;

aligning a contact mask to at least one feature on the front-side using an infrared viewer;

exposing the photoresist to generate a photoresist pattern of alignment features on the backside; and transferring the alignment features into the backside.

3. The method of claim 2, wherein the alignment features are transferred by etching into the backside.

4. The method of claim 2, wherein the alignment features are transferred by liftoff.

5. The method of claim 2, wherein the at least one feature on the front-side comprises the at least one opto-electronic device.

6. The method of claim 2, wherein the at least one feature on the front side comprises alignment marks formed on the front-side.

7. The method of claim 1, wherein the first and second sets of alignment features are aligned using an optical viewer.

8. The method of claim 2, wherein the first and second sets of alignment features are aligned using an optical viewer.

9. The method of claim 3, wherein the first and second sets of alignment features are aligned using an optical viewer.

10. The method of claim 4, wherein the first and second sets of alignment features are aligned using an optical viewer.

11. The method of claim 5, wherein the first and second sets of alignment features are aligned using an optical viewer.

12. The method of claim 6, wherein the first and second sets of alignment features are aligned using an optical viewer.

13. The method of claim 1, wherein the first and the second sets of alignment features are aligned into approximate position and at least one set of solder balls disposed on the backside is positioned to generate a force during bonding acting to bring the die into alignment with the submount.

14. The method of claim 1, wherein the first and second sets of alignment features are aligned into approximate position and at least one set of solder balls disposed on the mounting surface is positioned to generate a force during bonding acting to bring the die into alignment with the submount.

15. The method of claim 1, wherein the first and second sets of alignment features are aligned into approximate position and at least one set of solder balls disposed on the backside and another set of solder balls disposed on the mounting surface are mated to generate a force during bonding acting to bring the die into alignment with the mount.

16. The method of claim 1, wherein the submount includes at least one alignment guide for aligning the submount to an optical component, the method further comprising:

passively aligning the optical component to the at least one opto-electronic device disposed on the front-side of the die using the alignment guide; and fixing the position of the optical component.

17. The method of claim 16, wherein the alignment guide comprises at least one guide hole and the optical component is aligned to the submount via a guide pin disposed in each guide hole.

18. The method of claim 17 wherein the optical component comprises an array of lenses.

19. The method of claim 1, wherein the submount comprises a chip carrier and the at least one opto-electronic device comprises an array of vertical cavity surface emitting lasers.

20. The method of claim 1, wherein the submount comprises a chip carrier and the at least one opto-electronic device comprises an array of detectors.

21. The method of claim 1, wherein the submount comprises a chip carrier.

22. The method of claim 1, wherein the at least one opto-electronic device comprises an edge-emitting laser and the submount includes at least one opto-electronic component shaped to receive light from the edge-emitting laser responsive to the laser being substantially aligned to a preselected position on the submount.

23. The method of claim 1 wherein the at least one opto-electronic component is selected from the group consisting of an optical detector, an optical deflector, an optical modulator, an optical waveguide, an optical amplifier, and an optical lens.

24. A mounted opto-electronic die manufactured by the process of claim 1.

25. A mounted opto-electronic die manufactured by the process claim 2.

26. An optical assembly manufactured by the process of claim 16.

27. An optical assembly, comprising:

a submount;

a die having a front-side and an opposed backside;

at least one opto-electronic device disposed on the front-side of the die;

the backside of the die bonded to the submount with a first set of alignment features disposed on the backside of the die aligned to a corresponding second set of alignment features disposed on the submount; and at least one optical component passively aligned to the submount by an alignment guide disposed on the submount.

28. The optical assembly of claim 27, wherein the alignment guide comprises at least one hole shaped to receive a guide pin and the at least one other optical device is aligned to the submount via the guide pin.

29. The optical assembly of claim 28, wherein the at least one opto-electronic component comprises an array of opto-electronic devices.

30. The optical assembly of claim 29, wherein the at least one optical component comprises a lens array shaped to couple light between a fiber array and the array of opto-electronic devices.

31. The optical assembly of claim 30, wherein the array of opto-electronic devices comprises an array of vertical cavity surface emitting lasers.

32. The optical assembly of claim 27, wherein the first set of alignment features is formed to be indicative of the location of the at least one opto-electronic device.

33. An optical assembly, comprising:

a submount having first and second guide holes;

a die having a front-side and an opposed backside;

at least one opto-electronic device disposed on the front-side of the die;

a first set of alignment features disposed on the backside of the die indicative of the position of the at least one opto-electronic device;

the backside of the die bonded to the submount with the first set of alignment features disposed on the backside of the die aligned to a corresponding second set of alignment features disposed on the submount;

first and second guide pins; and at least one optical component aligned to the submount via the guide pins disposed in the guide holes.

34. The optical assembly of claim 33, wherein the at least one opto-electronic device comprises an array of opto-electronic devices.

35. The optical assembly of claim 33, wherein the array of opto-electronic devices comprises an array of vertical cavity surface emitting lasers.

36. An optical assembly, comprising:

an array of vertical cavity surface emitting lasers disposed on a front-side of a die; and a plurality of alignment features disposed on a backside of the die, the alignment features indicative of the locations of the lasers;

the backside of the die bonded to a submount with the plurality of alignment features aligned to a corresponding set of alignment features disposed on the submount.

37. The optical assembly of claim 36, further comprising:

a lens array passively aligned to the submount for coupling light between the opto-electronic devices and an array of waveguides.

38. The optical assembly of claim 37, wherein the array of waveguides is a fiber array.

39. The optical assembly of claim 38, wherein the lens array, submount, and fiber array are aligned by at least one guide pin.

40. The optical assembly of claim 37, wherein the submount includes at least one guide hole for receiving a guide pin to passively align the lens array to the submount and the array of waveguides.

* * * * *